United States Patent
Bang et al.

(10) Patent No.: US 11,276,745 B2
(45) Date of Patent: Mar. 15, 2022

(54) DISPLAY DEVICE WITH IMPROVED SENSITIVITY OF SENSING SIGNAL LINES

(71) Applicant: SAMSUNG DISPLAY CO., LTD., Yongin-si (KR)

(72) Inventors: Ki Ho Bang, Hwaseong-si (KR); Won Suk Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/887,224

(22) Filed: May 29, 2020

(65) Prior Publication Data

US 2021/0083033 A1   Mar. 18, 2021

(30) Foreign Application Priority Data

Sep. 16, 2019   (KR) ........................ 10-2019-0113656

(51) Int. Cl.
*H01L 27/32*    (2006.01)
*G06F 3/041*    (2006.01)
*G06F 3/044*    (2006.01)

(52) U.S. Cl.
CPC ........ *H01L 27/3276* (2013.01); *G06F 3/0412* (2013.01); *H01L 27/323* (2013.01); *G06F 3/044* (2013.01); *G06F 2203/04107* (2013.01)

(58) Field of Classification Search
CPC ............. H01L 27/3276; H01L 27/3288; H01L 27/3297; G06F 2203/04107
See application file for complete search history.

(56) References Cited

U.S. PATENT DOCUMENTS

| 2012/0025403 A1* | 2/2012 | Yokogawa | H01L 23/528 257/786 |
| 2020/0091252 A1 | 3/2020 | Bang et al. | |
| 2021/0050395 A1* | 2/2021 | Okabe | H05B 33/06 |

FOREIGN PATENT DOCUMENTS

| KR | 10-2017-0079956 | 7/2017 |
| KR | 10-2018-0014378 | 2/2018 |
| KR | 10-2018-0014396 | 2/2018 |
| KR | 10-2018-0014398 | 2/2018 |
| KR | 10-2019-0048784 | 5/2019 |

* cited by examiner

*Primary Examiner* — Laurence J Lee
(74) *Attorney, Agent, or Firm* — F. Chau & Associates, LLC

(57) ABSTRACT

A display device including: a substrate; a pixel circuit; a light emitting element including a first electrode, a light emitting; layer, and a second electrode: signal lines; a first voltage supply line overlapping the signal lines, configured to supply a first voltage to the pixel circuit, and, including first lower and upper conductive layers; a second voltage supply overlapping the signal lines, configured to supply a second voltage to the second electrode, and including a second lower conductive layer on a same layer as the first lower conductive layer and a second upper conductive layer on the second lower conductive layer on a same layer as the first upper conductive layer, an encapsulation layer on the second electrode, and the first and second voltage supply lines; and sensing signal lines on the encapsulation layer, the first lower conductive layer and the second upper conductive layer overlapping each other.

21 Claims, 9 Drawing Sheets

DISPLAY DEVICE WITH IMPROVED SENSITIVITY OF SENSING SIGNAL LINES

CROSS-REFERENCE TO RELATED APPLICATION(S)

This application claims priority under 35 U. S. C. § 119 to Korean Patent Application No. 10-2019-0113656 filed on Sep. 16, 2019 in the Korean Intellectual Property Office (KIPO), the disclosure of which is incorporated by reference herein in its entirety.

TECHNICAL FIELD

Exemplary embodiments of the present invention relate to a display device. More particularly, exemplary embodiments of the present invention relate to a display device including a sensing layer.

DESCRIPTION OF THE RELATED ART

A display device is an output device for presentation of information in visual form, for example. Various display devices, which are used for a multimedia device such as a television, a mobile phone, a tablet computer, a navigation system, and a game machine, have been developed. A keyboard, a mouse, and the like are used as an input device for the display device. Recently, the display device may include a sensing unit as an input tool. The sensing unit may include a touchscreen, for example.

SUMMARY

A display device according to an exemplary embodiment of the present invention may include a substrate; a pixel circuit disposed on the substrate; a light emitting element including a first electrode electrically connected to the pixel circuit, a light emitting layer disposed on the first electrode, and a second electrode disposed on the tight emitting layer; a plurality of signal lines disposed on the substrate; a first voltage supply line overlapping the signal lines, configured to supply a first voltage to the pixel circuit, and including a first lower conductive layer and a first upper conductive layer disposed on the first lower conductive layer; a second voltage supply line overlapping the signal lines, configured to supply a second voltage to the second electrode, and including a second lower conductive layer disposed on a same layer as the first lower conductive layer and a second upper conductive layer disposed on the second lower conductive layer on a same layer as the first upper conductive layer; an encapsulation layer disposed on the second electrode, the first voltage supply line, and the second voltage supply line; and a plurality of sensing signal lines disposed on the encapsulation layer, wherein the first lower conductive layer and the second upper conductive layer overlap each other.

At least one of the first lower conductive layer and the second upper conductive layer may be located in an area where the signal lines and the sensing signal lines overlap each other.

At least a portion of the sensing signal lines may not be overlapped by the second electrode.

An end of the first lower conductive layer may extend beyond an end of the second electrode along a direction parallel to a surface of the substrate.

An end of the second electrode may extend beyond an end of the first lower conductive layer along a direction parallel to a surface of the substrate.

The pixel circuit may include a transistor, and at least one of the signal lines may be disposed on a same layer as a gate electrode of the transistor.

The pixel circuit may further include a capacitor, and at least one of the signal lines may be disposed on a same layer as an electrode of the capacitor.

The display device may further include a data line configured to supply a data signal to the pixel circuit, wherein the first lower conductive layer and the second lower conductive layer may be disposed on a same layer as the data line.

The display device may further include a first voltage line connecting the first voltage supply line to the pixel circuit, wherein the first upper conductive layer and the second upper conductive layer may be disposed on a same layer as the first voltage line.

The display device may further include a plurality of dams disposed between the second voltage supply line and the encapsulation layer.

The encapsulation layer may include at least one inorganic encapsulation layer and at least one organic encapsulation layer, and an end of the at least one organic encapsulation layer may be adjacent to a side of at least one of the dams.

The display device may further include an organic insulating layer disposed between the first lower conductive layer and the first, upper conductive layer and between the second lower conductive layer and the second upper conductive layer.

A plurality of through-holes may be provided in the second upper conductive layer.

The through-holes may overlap the first lower conductive layer.

The through-holes may overlap the second electrode.

A display device according to an exemplary embodiment of the present invention may include a display device including: a substrate; a pixel circuit disposed on the substrate; a light emitting element including a first electrode electrically connected to the pixel circuit, a light emitting layer disposed on the first electrode, and a second electrode disposed on the light emitting layer; a plurality of signal lines disposed on the substrate; a first voltage supply line overlapping the signal lines, configured to supply a first voltage to the pixel circuit, and, including a first lower conductive layer and a first upper conductive layer disposed on the first lower conductive layer; a second voltage supply line overlapping the sig al lines, configured to supply a second voltage to the second electrode, and including a second lower conductive layer disposed on a same layer as the first lower conductive layer and a second upper conductive layer disposed on the second lower conductive layer on a same layer as the first upper conductive layer; an encapsulation layer disposed on the second electrode, the first voltage supply line, and the second voltage supply line; and a plurality of sensing signal lines disposed on the encapsulation layer, wherein the first upper conductive layer and the second lower conductive layer overlap each other.

At least one of the first upper conductive layer and the second lower conductive layer may be located in an area where the signal lines and the sensing signal lines overlap each other.

At least a portion of the sensing signal lines may not overlap the second electrode.

An end of the first upper conductive layer may extend beyond an end of the second electrode along a direction parallel to a surface of the substrate.

A plurality of through-holes overlapping the second lower conductive layer may be provided in the first upper conductive layer.

A display device according to an exemplary embodiment of the present invention may include a substrate; a pixel circuit disposed on the substrate; a light emitting element including a first electrode and a second electrode, wherein the first electrode is electrically connected to the pixel circuit; a plurality of signal lines disposed on the substrate; a first voltage supply line overlapping the signal lines, configured to supply a first, voltage to the pixel circuit, and including a first conductive layer; a second voltage supply line overlapping the signal lines, configured to supply a second voltage to the second electrode, and including a second conductive layer; an encapsulation layer disposed on the second electrode, the first voltage supply line, and the second voltage supply line; and a plurality of sensing signal lines disposed on the encapsulation layer, wherein the first conductive layer and the second conductive layer overlap the signal lines.

BRIEF DESCRIPTION OF THE DRAWINGS

The above and other features of the present invention will be more clearly understood by describing in detail exemplary embodiments thereof with reference to the accompanying drawings.

DETAILED DESCRIPTION OF THE EMBODIMENTS

Hereinafter, display devices in accordance with exemplary embodiments of the present invention will be explained in detail with reference to the accompanying drawings.

Figure 1:
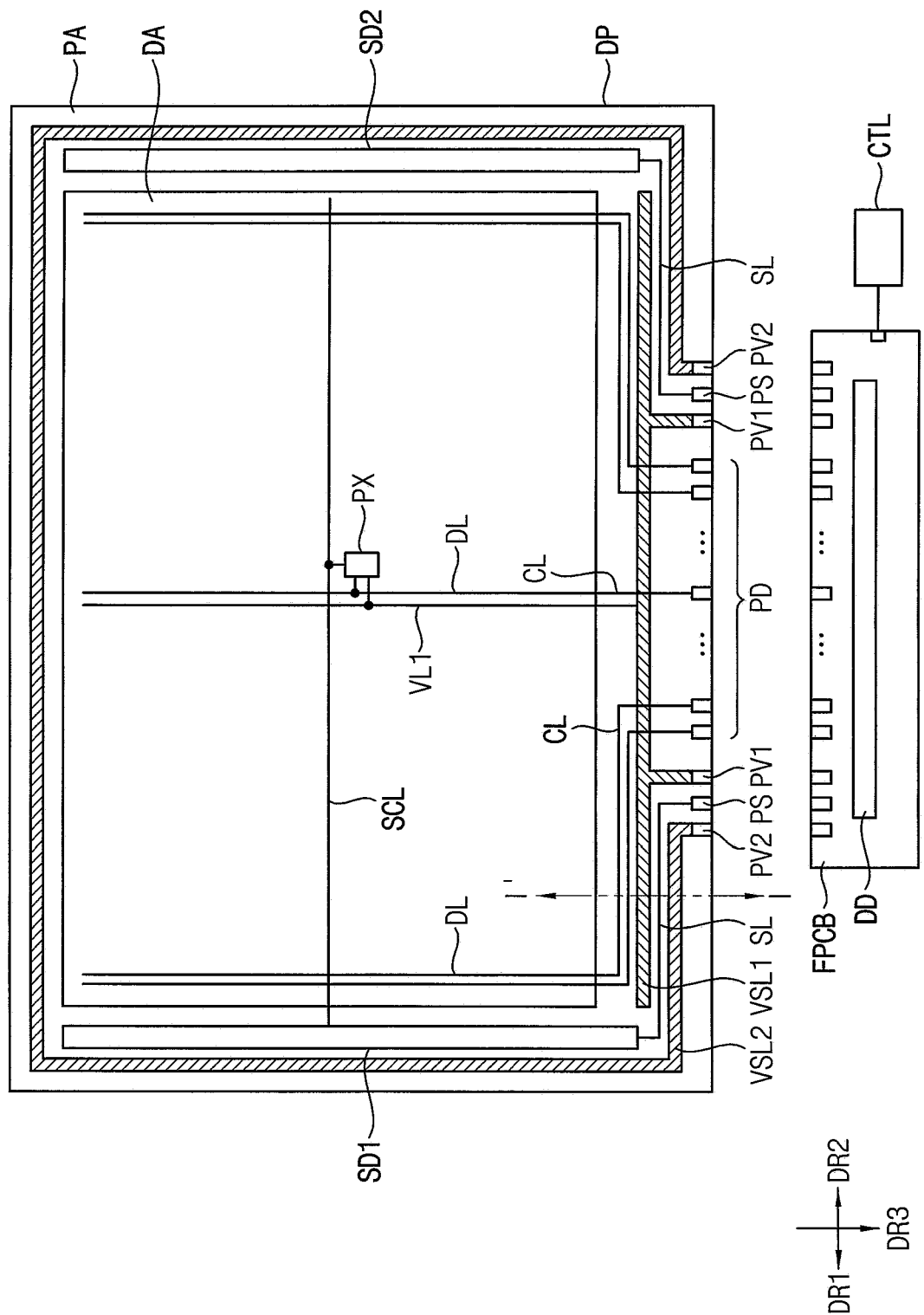
FIG. 1 is a plan view showing a display device according to an exemplary embodiment of the present invention.

FIG. 1 is a plan view showing a display device according to an exemplary embodiment of the present invention.

Referring to FIG. 1, a display device according, to an exemplary embodiment of the present invention may include a display panel DP and a flexible printed circuit board FPCB.

The display panel DP may include a display area DA and a peripheral area PA. The peripheral area PA may be disposed on an outer side of the display area DA. In an exemplary embodiment of the present invention, the peripheral area PA may surround the display area DA.

A plurality of pixels PX may be disposed in the display area DA. Each of the pixels PX may be connected to a scan line extending in a first direction DR1, and a data line DL and a first voltage line VL1 extending in a third direction DR3 intersecting with the first direction DR1.

A first scan driver SD1, a second scan driver SD2, pads, signal lines SL, connection lines CL, a first voltage supply line VSL1, and a second voltage supply line VSL2 may be disposed in the peripheral area PA.

In an exemplary embodiment of the present invention, the first scan driver SD1 may be disposed in the first direction DR1 from the display area DA, and the second scan driver SD2 may be disposed in a second direction DR2 opposite to the first direction DR1 from the display area DA, but the present invention is not limited thereto. In another exemplary embodiment of the present invention, the first and second scan drivers SD1 and SD2 may be disposed in the first direction DR1 or the second direction DR2 from the display area DA. The first scan driver SD1 and the second scan driver SD2 may generate a scan signal based on signals transmitted from the signal lines SL, and the scan signal may be sequentially transmitted to the pixels PX through the scan lines SCL.

The pads may be disposed in the third direction DR3 from the display area DA, and arranged along the first direction DR1. The pads may include signal pads PS, data pads PD, first voltage pad PV1, and a second voltage pad PV2. The data pads PD may be disposed between two first voltage pads PV1, for example.

The signal lines SL may connect the signal pads PS to the first and second scan drivers SD1 and SD2. The signal lines SL may supply signals transmitted from the signal pads PS to the first scan driver SD1 and the second scan driver SD2.

The connection lines CL may connect the data pads PD to the data lines DL. For example, the connection lines CL may extend from the data pads PD in the peripheral area PA to the data line DL in the display area DA. The connection lines CL may transmit data signals transmitted from the data pads PD to the data lines DL to supply the data signals to the pixels PX.

The first voltage supply line VSL1 may connect the first voltage pad PV1 to the first voltage line VL1. The first voltage supply line VSL1 may supply a first voltage transmitted from the first voltage pad PV1 to the first voltage line VL1.

The second voltage supply line VSL2 may connect the second voltage pad PV2 to the pixels PX. The second voltage supply line VSL2 may supply a second voltage transmitted from the second voltage pad PV2 to the pixels PX.

The flexible printed circuit board FPCB may electrically connect a control unit CTL to the pads. For example, the flexible printed circuit board FPCB may include pads corresponding to the pads of the display panel DP. Signals or voltages transmitted from the control unit CTL, may be transmitted to the pads through the flexible printed circuit hoard FPCB.

In an exemplary embodiment of the present invention, a data driver DID may be disposed on the flexible printed circuit board FPCB, but the present invention is not limited thereto. In another exemplary embodiment of the present invention, the data driver DD may be disposed in the peripheral area PA of the display panel DP. The data driver DD may generate a data signal to provide the data signal to the pixels PX.

Figure 2:
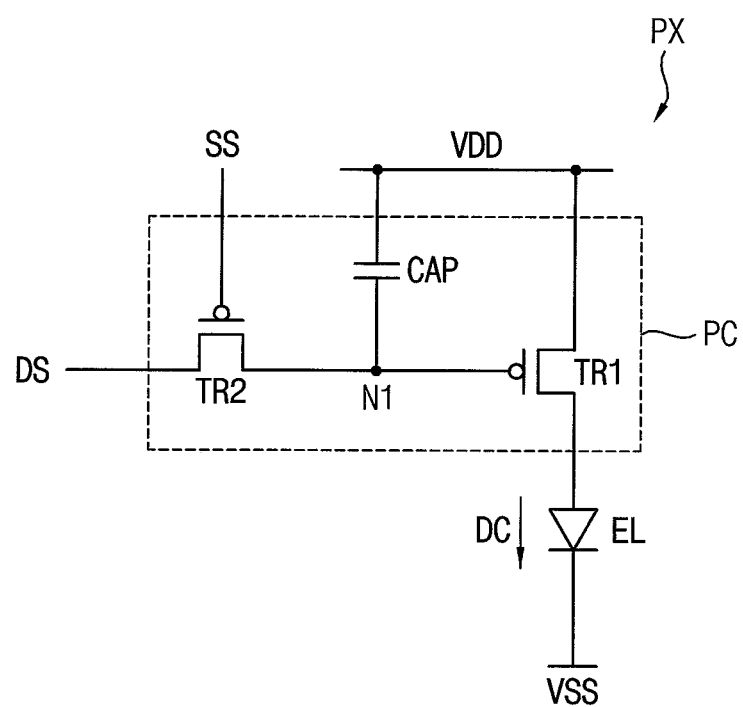
FIG. 2 is an equivalent circuit diagram showing a pixel of FIG. 1.

FIG. 2 is an equivalent circuit diagram showing a pixel PX of FIG. 1.

Referring to FIG. 2, the pixel PX may include a pixel circuit PC and a light emitting element EL connected to the pixel circuit PC. The pixel circuit PC may generate a driving current DC by receiving a scan signal SS, a data signal DS, and a first voltage VDD to provide the driving current DC to the light emitting element EL. The light emitting element EL may receive a second voltage VSS to emit light based on the driving current DC provided from the pixel circuit PC. The pixel circuit PC may include at least one transistor and at least one capacitor to generate the driving current DC.

In an exemplary embodiment of the present invention, the pixel circuit PC may include a first transistor TR1, a second transistor TR2, and a capacitor CAP.

A gate electrode of the first transistor TR1 may be connected to a first node N1. The first voltage VDD may be applied to a source electrode of the first transistor TR1, and a drain electrode of the first transistor TR1 may be connected to the light emitting element EL. The first transistor TR1 may generate the driving current DC based on a voltage between the gate electrode and the source electrode thereof to transmit the driving current DC to the light emitting element EL.

The scan signal SS, may be applied to a gate electrode of the second transistor TR2. The data signal DS may be applied to a source electrode of the second transistor TR2, and a drain electrode of the second transistor TR2 may be connected to the first node N1. The second transistor TR2 may transmit the data signal DS to the first node N1 based on the scan signal SS.

The first voltage VDD may be applied to a first electrode of the capacitor CAP, and a second electrode of the capacitor CAP may be connected to the first node N1. The capacitor CAP may maintain a voltage between the gate electrode and the source electrode of the first transistor TR1 even when the second transistor TR2 is turned off, so that the light emitting element EL may emit light.

A first electrode of the light emitting element EL may be connected to the pixel circuit PC, and the second voltage VSS may be applied to a second electrode of the light emitting element EL. In an exemplary embodiment of the present invention, the second voltage VSS may be smaller than the first voltage VDD. The light emitting element EL may emit light based on the driving current DC transmitted from the pixel circuit PC.

Figure 3:
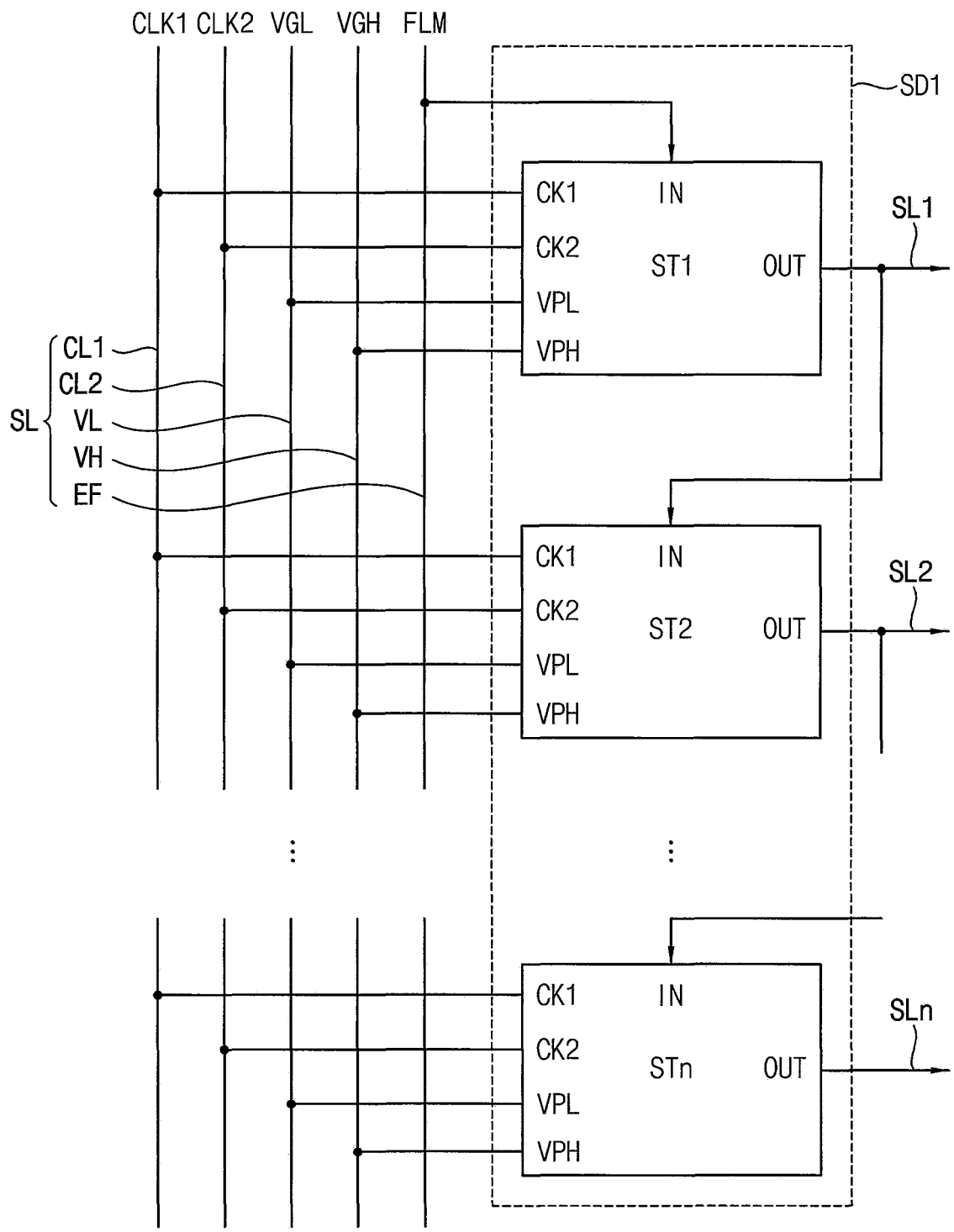
FIG. 3 is a block diagram showing a scan driver of FIG. 1.

FIG. 3 is a block diagram showing a scan driver of FIG. 1. For example, FIG. 3 may show the first scan drive SD1. The configuration of the second scan driver SD2 may be substantially identical or similar to the configuration of the first scan driver SD1.

Referring to FIG. 3, the first scan driver SD1 may include a plurality of stages ST1, ST2, . . . , and STn. Scan control signals may be provided to the stages ST1, ST2, . . . , and STn through the signal line SL. The signal line SL may include a first clock signal line CL1, a second clock signal line CL2, a third voltage line VL, a fourth voltage line VH, and an initiation signal line EF, The first clock signal line CL1, the second clock signal line CL2, the third voltage line VL, the fourth voltage line VH, and the initiation signal line EF may transmit a first clock signal CLK1, a second clock signal CLK2, a third voltage VGL, a fourth voltage VGH, and an initiation signal FLM, respectively.

Each of the stages ST1, ST2, . . . , and STn may include a first clock terminal CK1, a second clock terminal CK2, a third voltage input terminal VPL, a fourth voltage input terminal VPH, an input terminal IN, and an output terminal OUT.

The first clock terminal CK1 may receive the first clock signal CLK1, and the second clock terminal CK2 may receive the second clock signal CLK2. A phase of the first clock signal CLK1 and a phase of the second clock signal CLK2 may be different from each other. For example, the phase of the second clock signal CLK2 may be opposite to the phase of the first clock signal CLK1, or the phase of the second clock signal CLK2 may be delayed from the phase of the first clock signal CLK1.

The third voltage input terminal VPL may receive the third voltage VGL, and the fourth voltage input terminal VPH may receive the fourth voltage VGH. A voltage level of the third voltage VOL may be lower than a voltage level of the fourth voltage VGH.

An input terminal IN of a first stage ST1 among the stages ST1, ST2, . . . , and STn may receive the initiation signal FLM, and the remaining stages ST2, . . . , and STn among the stages ST1, ST2, . . . , and STn may receive an output signal of the previous stage. For example, a second stage ST2 may receive an output signal of the first stage ST1 The output terminal OUT may provide a scan signal generated from the stage to the scan line and the input terminal IN of the next stage. For example, the output terminal of the first stage ST1 may provide a scan signal to a first scan line SL1, the output terminal of the second stage ST2 may provide a scan signal to a second scan line SL2, etc.

Figure 4:
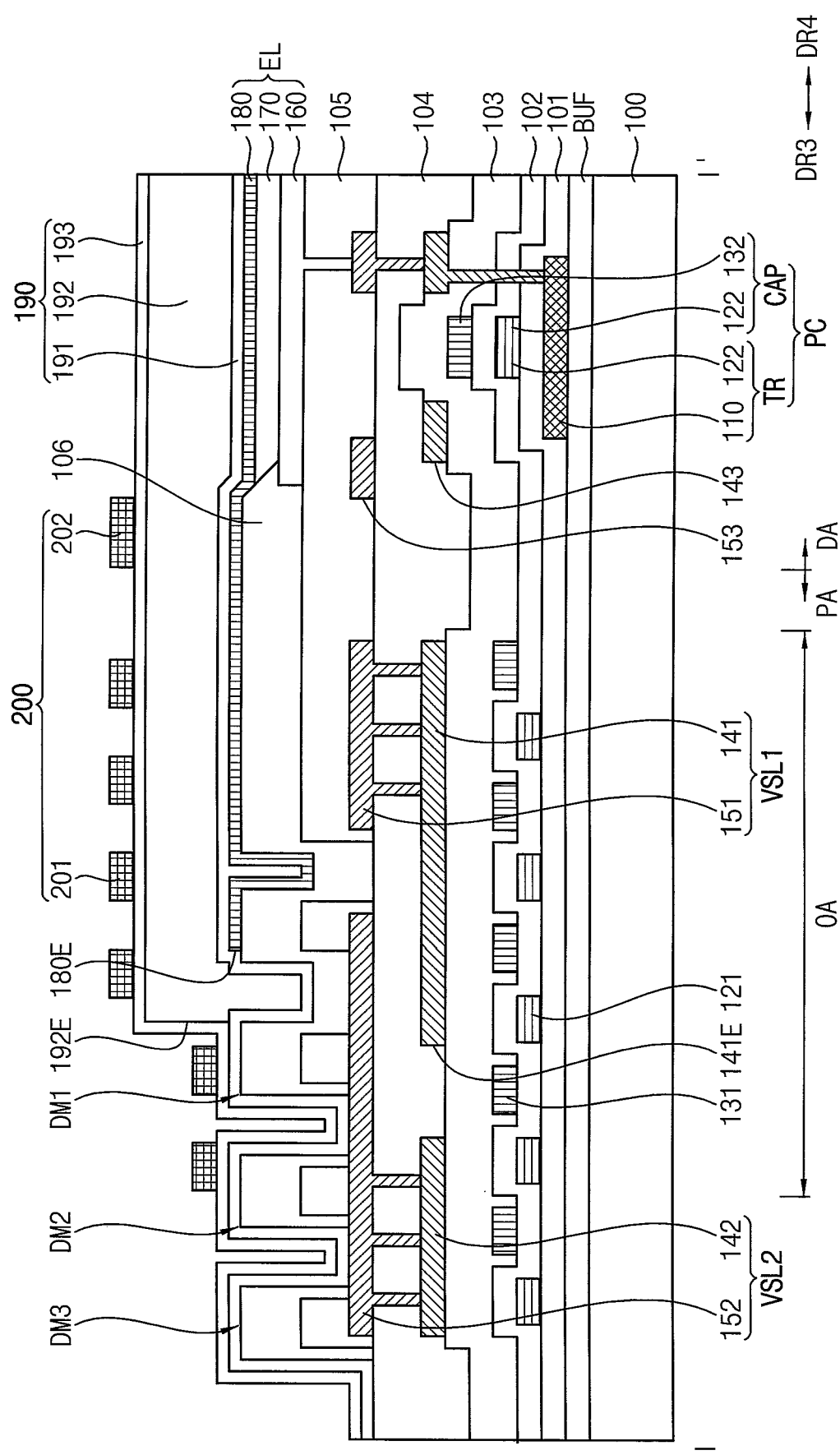
FIG. 4 is a sectional view showing the display device according to an exemplary embodiment of the present invention.

FIG. 4 is a sectional view showing the display device according to an exemplary embodiment of the present invention. FIG. 4 shows an example of the display device, taken along line I-I' of FIG. 1.

Referring to FIG. 4, the pixel circuit PC including the transistor TR and the capacitor CAP, a data line 143, a first voltage line 153, and the light emitting element EL may be disposed in the display area DA on a substrate 100. The transistor TR, the data line 143, and the first voltage line 153 may be the first transistor TR1 of FIG. 2, the data line DL of FIG. 1, and the first voltage line VL1 of FIG. 1, respectively. First signal lines 121, second signal lines 131, the first voltage supply line VSL1, and the second voltage supply line VSL2 may be disposed in the peripheral area PA on the substrate 100.

The substrate 100 may be an insulating substrate including glass, quartz, plastic, and the like. In an exemplary embodiment of the present invention, the substrate 100 may include a first flexible layer, a first barrier layer disposed on the first flexible layer, a second flexible layer disposed on the first barrier layer, and a second barrier layer disposed on the second flexible layer. The first flexible layer and the second flexible layer may include an organic insulating material such as polyimide (PI), and the first barrier layer and the second barrier layer may include an inorganic insulating material such as silicon oxide, silicon nitride, and amorphous silicon.

A buffer layer BUF may be disposed on the substrate 100. The buffer layer BUF may prevent impurities such as oxygen and moisture from being diffused to an upper portion of the substrate 100 through the substrate 100. In addition, the buffer layer BUF may provide a flat top surface on the upper portion of the substrate 100. The buffer layer BUF may include an inorganic insulating material such as silicon oxide, silicon nitride, and silicon oxynitride.

An active layer 110 may be disposed on the buffer layer BUF. The active layer 110 may be formed of amorphous silicon, polycrystalline silicon, an oxide semiconductor, and the like. The active layer 110 may include a source region, a drain region, and a channel region disposed between the source region and the drain region. The source region and the drain region may be doped with P-type or N-type impurities.

A first insulating layer 101 may be disposed on the active layer 110. The first insulating layer 101 may be disposed on the buffer layer BUF to cover the active layer 110. The first insulating layer 101 may insulate a gate electrode 122 disposed on the active layer 110 from the active layer 110. The first insulating layer 101 may include an inorganic insulating material such as silicon oxide, silicon nitride, and silicon oxynitride.

The gate electrode 122 may be disposed on the first insulating layer 101. The gate electrode 122 may overlap the channel region of the active layer 110. The gate electrode 122 may include a conductive material such as molybdenum (Mo) and copper (Cu). The active layer 110, which includes the source region, the drain region, and the channel region, and the gate electrode 122 may form the transistor TR.

A second insulating layer 102 may be disposed on the gate electrode 122. The second insulating layer 102 may be disposed on the first insulating layer 101 to cover the gate electrode 122. The second insulating layer 102 may insulate a capacitor electrode 132 disposed on the gate electrode 122 from the gate electrode 122. In an exemplary embodiment of the present invention, the second insulating layer 102 may include an inorganic insulating material such as silicon oxide, silicon nitride, and silicon oxynitride.

The capacitor electrode 132 may be disposed on the second insulating layer 102. The capacitor electrode 132 may overlap the gate electrode 122. The capacitor electrode 132 may include a conductive material such as molybdenum (Mo) and copper (Cu). The gate electrode 122 and the capacitor electrode 132 may form the capacitor CAP. For example, the gate electrode 122 may be one of the electrodes of the capacitor CAP.

A third insulating layer 103 may be disposed on the capacitor electrode 132. The third insulating layer 103 may be disposed on the second insulating layer 102 to cover the capacitor electrode 132. The third insulating layer 103 may insulate the data line 143 disposed on the capacitor electrode 132 from the capacitor electrode 132. In an exemplary embodiment of the present invention, the third insulating layer 103 may include an inorganic insulating material such as silicon oxide, silicon nitride, and silicon oxynitride.

The data line 143 may be disposed on the third insulating layer 103. The data line 143 may be located in the display area DA. The data line 143 may include a conductive material such as aluminum (Al), titanium (Ti), and copper (Cu).

A fourth insulating layer 104 may be disposed on the data line 143. The fourth insulating layer 104 may be disposed on the third insulating layer 103 to cover the data line 143. The fourth insulating layer 104 may include an organic insulating material such as polyimide (PI).

The first voltage line 153 may be disposed on the fourth insulating layer 104. The first voltage line 153 may be located in the display area DA. The first voltage line 153 may include a conductive material such as aluminum (Al), titanium (Ti), and copper (Cu). As shown in FIG. 4, the first voltage line 153 may partially overlap the data line 143.

A fifth insulating layer 105 may be disposed on the first voltage line 153. The fifth insulating layer 105 may be disposed on the fourth insulating layer 104 to cover the first voltage line 153. The fifth insulating layer 105 may include an organic insulating material such as polyimide (PI).

A first electrode 160 may be disposed on the fifth insulating layer 105. The first electrode 160 may be electrically connected to the transistor TR. The first electrode 160 may include a conductive material such as a metal, an alloy, and transparent conductive oxide. For example, the first electrode 160 may include silver (Ag), indium tin oxide (ITO), and the like.

A sixth insulating layer 106 may be disposed on, the first electrode 160. The sixth insulating layer 106 may be disposed on the fifth insulating layer 105 to cover the first electrode 160. The sixth insulating layer 106 may have a pixel opening that exposes at least a portion of the first electrode 160. In an exemplary embodiment of the present invention, the pixel opening may expose a central portion of the first electrode 160, and the sixth insulating layer 106 may cover a peripheral portion of the first electrode 160. In other words, the sixth insulating layer 106 may cover an edge of the first electrode 160. The sixth insulating layer 106 may include an organic insulating material such as polyimide (PI).

A light emitting layer 170 may be disposed on the first electrode 160. The light emitting layer 170 may be disposed on the first electrode 160 which is exposed by the pixel opening. The light emitting layer 170 may include at least one of an organic light emitting material and a quantum dot.

In an exemplary embodiment of the present invention, the organic light, emitting material may include a low-molecular-weight organic compound or a high-molecular-weight organic compound. For example, the low-molecular-weight organic compound may include copper phthalocyanine, N,N'-dipbenylbenzidine, tris-(8-hydroxyquinoline)aluminum, and the like, and the high-molecular-weight organic, compound may include poly(3,4-ethylenedioxythiophene), polyaniline, poly-phenylenevinyiene, polyfluorene, and the like.

In an exemplary embodiment of the present invention, the quantum dot may include a core including a Group II-VI compound, a Group III-V compound, a Group IV-VI compound, a Group IV element, a Group IV compound, and combinations thereof. In an exemplary embodiment of the present invention, the quantum dot may have a core-shell structure including a core and a shell surrounding the core. The shell may serve as a protective layer for preventing the core from being chemically denatured to maintain semiconductor characteristics, and may serve as a charging layer for imparting electrophoretic characteristics to the quantum dot.

A second electrode 180 may be disposed on the light emitting layer 170, in an exemplary embodiment of the present invention, the second electrode 180 may also be disposed on the sixth insulating layer 106. For example, the second electrode 180 may directly contact the sixth insulating layer 106. The second electrode 180 may include a conductive material such as a metal, an alloy, and transparent conductive oxide. For example, the second electrode 180 may include aluminum (Al) platinum (Pt), silver (Ag), magnesium (Mg), gold (Au), chromium (Cr), tungsten (W), titanium (Ti), and the like. The first electrode 160, the light emitting layer 170, and the second electrode 180 may form the light emitting element EL.

The first signal lines 121 and the second signal lines 131 may be disposed on an outer side of the pixel circuit PC on the substrate 100.

The first signal lines 121 may be disposed in the peripheral area PA on the substrate 100. In an exemplary embodiment of the present invention, the first signal lines 121 may include substantially the same material as the gate electrode 122, and may be disposed on the same layer as the gate electrode 122. In this case, the first signal lines 121 may be disposed on the first insulating layer 101.

The second signal lines 131 may be disposed in the peripheral area PA on the first signal lines 121. In an exemplary embodiment of the present invention, the second signal lines 131 may not overlap the first signal lines 121. For example, the second signal lines 131 and the first signal lines 121 may be alternately arranged along the third direction DR3. In an exemplary embodiment of the present invention, the second signal lines 131 may include substantially the same material as the capacitor electrode 132, and may be disposed on the same layer as the capacitor electrode 132. In this case, the second signal lines 131 may be disposed on the second insulating layer 102.

The first signal lines 121 and the second signal lines 131 may include the signal line SL and the connection line CL of FIG. 1. In other words, the first signal lines 121 and the second signal lines 131 may include the connection line CL, the first clock signal line (CL1 of FIG. 3), the second clock signal line (CL2 of FIG. 3), the third voltage line (VL of FIG. 3), the fourth voltage line (VH of FIG. 3), and the initiation signal line (EF of FIG. 3). Accordingly, the first signal lines 121 and the second signal lines 131 may transmit the data signal (DS of FIG. 2), the first clock signal (CLK1 of FIG. 3), the second cluck signal (CLK2 of FIG. 3), the third voltage (VGL of FIG. 3), the fourth voltage (VGH of FIG. 3), and the initiation voltage (FLM of FIG. 3).

In an exemplary embodiment of the present invention, the first signal lines 121 may include a portion of the first clock signal line CL1, the second clock signal CL2, the third voltage line VL, the fourth voltage line VH, the initiation signal line EF, and the connection line CL, and the second signal lines 131 may include another portion of the first clock signal line CL1, the second clock signal line CL2, the third voltage line VL, the fourth voltage line the initiation signal line EF, and the connection line CL.

The first voltage supply line VSL1 and the second voltage supply line VSL2 may be disposed on the first signal lines 121 and the second signal lines 131. The first voltage supply line VSL1 may supply the first voltage (VDD of FIG. 2) to the pixel circuit PC. The second voltage supply line VSL2 may be disposed on an outer side of the first voltage supply line VSL1 to supply the second voltage (VSS of FIG. 2) to the second electrode 180. For example, the second voltage supply line VSL2 may be located in the third direction DR3 from the first voltage supply line VSL1. In other words, the second voltage supply line VSL2 is spaced apart from the first voltage supply line VSL1 along the third direction DR3.

The first voltage supply line VSL1 ma include a first lower conductive layer 141 and a first upper conductive layer 151 disposed on the first lower conductive layer 141. The first lower conductive layer 141 and the first upper conductive layer 151 may be electrically connected to each other. For example, the first lower conductive layer 141 and the first upper conductive layer 151 may be electrically connected to each other through paths in the fourth insulating layer 104.

The second voltage supply line VSL2 may include a second lower conductive layer 142 and a second upper conductive layer 152 disposed on the second lower conductive layer 142. The second lower conductive layer 142 may be disposed on substantially the same layer as the first lower conductive layer 141, and the second upper conductive layer 152 may be disposed on substantially the same layer as the first upper conductive layer 151. The second lower conductive layer 142 and the second upper conductive layer 152 may be electrically connected to each other. For example, the second lower conductive layer 142 and the second upper conductive layer 152 may be electrically connected to each other through paths in the fourth insulating layer 104.

In an exemplary embodiment of the present invention, the first lower conductive layer 141 and the second lower conductive layer 142 may include substantially the same material as the data line 143, and may be disposed on substantially the same layer as the data line 143. In this case, the first lower conductive layer 141 and the second lower conductive layer 142 may be disposed on the third insulating layer 103.

In an exemplary embodiment of the present invention, the first upper conductive layer 151 and the second upper conductive layer 152 may include substantially the same material as the first voltage line 153, and may be disposed on substantially die same layer as the first voltage line 153. In this case, the first tapper conductive layer 151 and the second upper conductive layer 152 may be disposed on the fourth insulating layer 104.

The first lower conductive layer 141 and the first upper conductive layer 151 may be connected to each other through contact holes formed in the fourth insulating layer 104. The second lower conductive layer 142 and the second upper conductive layer 152 may be connected to each other through the contact holes formed in the fourth insulating layer 104.

The second electrode 180 may extend to the outer side of the display area DA. In other words, the second electrode 180 may extend from the display area DA to the peripheral area PA. For example, the second electrode 180 may extend in the third direction DR3. In this case, an end 180E of the second electrode 180 may be located in the peripheral area PA. The end 180E of the second electrode 180 may overlap portions of the first and second voltage supply lines VSL1 and VSL2.

In an exemplary embodiment of the present invention, an end 141E of the first lower conductive layer 141 may be located on an outer side of the end 180E of the second electrode 180. In other words, the end 180E of the second electrode 180 may be located on an inner side of the end 141E of the first lower conductive layer 141. For example, the end 141E of the first lower conductive layer 141 may be located in the third direction DR3 from the end 180E of the second electrode 180. In this case, the end 141E of the first lower conductive layer 141 and the end 180E of the second electrode 180 do not overlap each other.

An encapsulation layer 190 may be disposed on the second electrode 180, the first voltage supply line VSL1, and the second voltage supply line VSL2. The encapsulation layer 190 may cover the light emitting element EL to protect the light emitting element EL from impurities such as oxygen and moisture.

The encapsulation layer 190 may include at least one inorganic encapsulation layer and at least one organic encapsulation layer. The inorganic encapsulation layer ma include silicon nitride, silicon oxynitride, and the like, and the organic encapsulation layer may include an epoxy-based resin, an acryl-based resin, a polyimide-based resin, and the like.

In an exemplary embodiment of the present invention, the encapsulation layer 190 may include a first inorganic encapsulation layer 191, an organic encapsulation layer 192, and a second inorganic encapsulation layer 193. The first inorganic encapsulation layer 191 may be disposed on the second electrode 180, the first voltage supply line VSL1, and the second voltage supply line VSL2. The first inorganic encapsulation layer 191 may be formed along a lower profile of the encapsulation layer 190, so that the first inorganic encapsulation layer 191 may have an uneven top surface. The first inorganic encapsulation layer 191 may extend to an outer side of the second voltage supply line VSL2.

The organic encapsulation layer 192 may be disposed on the first inorganic encapsulation layer 191. The organic encapsulation layer 192 may have a flat top surface. The organic encapsulation layer 192 may be located at least in the display area DA. For example, the organic encapsulation layer 192 may also be located in the peripheral area PA.

The second inorganic encapsulation layer 193 may be disposed on the organic encapsulation layer 192. The second inorganic encapsulation layer 193 may be formed along an upper profile of the encapsulation layer 190, so that the second inorganic encapsulation layer 193 may have a flat top surface. The second inorganic encapsulation layer 193 may extend to the outer side of the second voltage supply line VSL2. Accordingly, the first inorganic encapsulation layer 191 and the second inorganic encapsulation layer 193 may contact each other on the outer side of the second voltage supply line VSL2.

A plurality of dams may be disposed between the second voltage supply line VSL2 and the encapsulation layer 190. For example, the dams may be disposed between the second upper conductive layer 152 and the first inorganic encapsulation layer 191. In an exemplary embodiment of the present invention, the dams may include a first dam DM1, a second dam DM2, and a third dam DM3. The second dam DM2 may be disposed on an outer side of the first dam DM1, and the third dam DM3 may be disposed on an outer side of the second dam DM2.

Each of the first dam DM1, the second dam DM2, and the third dam DM3 may include substantially the same material as the fifth insulation layer 105 and substantially the same material as the sixth insulation layer 106, respectively. For example, the first dam DM1, the second dam DM2, and the third dam DM3 may be formed at substantially the same time as the fifth insulating layer 105 and the sixth insulating layer 106.

The first, second and third dams DM1, DM2, and DM3 may prevent the organic encapsulation layer 192 from being formed on the outer side of the second voltage supply line VSL2 during a process of forming the organic encapsulation layer 192. Accordingly, an end 192E of the organic encapsulation layer 192 may be located on an inner side of at least one of the dams DM1, DM2, and DM3. In an exemplary embodiment of the present invention, as shown in FIG. 4, the end 192E of the organic encapsulation layer 192 may be located on an inner side of the first dam DM1 but the present invention is not limited thereto. In another exemplary embodiment of the present invention, the end of the organic encapsulation layer 192 may be located on an inner side of the second dam DM2 or an inner side of the third dam DM3. In addition, the first, second and third dams DM1, DM2, and DM3 may provide a concavo-convex top surface on a lower portion of the encapsulation layer 190, so that a contact area between the first inorganic encapsulation layer 191 and the second inorganic encapsulation layer 193 may be increased on the first, second and third dams DM1, DM2, and DM3. Therefore, adhesion between the first inorganic encapsulation layer 191 and the second inorganic encapsulation layer 193 may be increased.

A sensing layer 200 may be disposed on the encapsulation layer 190. The sensing, layer 200 may obtain coordinate information of an external input. In this case, the external input may be a contact or approach of a user, an external object, and the like with respect to the display device. In an exemplary embodiment of the present invention, the sensing layer 200 may sense the external input in a capacitive scheme, but an operating scheme of the sensing layer 200 is not limited thereto. In another exemplary embodiment of the present invention, the sensing layer 200 may sense the external input by an electromagnetic induction scheme, a pressure sensing scheme, and the like.

The sensing layer 200 may include sensing signal lines 201 and sensing electrodes 202. The sensing signal lines 201 may be disposed in the peripheral area PA, and the sensing electrodes 202 may be disposed in the display area DA. The sensing signal lines 201 may transmit driving signals to the sensing electrodes 202, or receive sensing signals from the sensing electrodes 202.

In an exemplary embodiment of the present invention, the sensing signal lines 201 and, the sensing electrodes 202 may include indium, tin oxide (ITO), indium zinc oxide (IZO), zinc oxide (ZnO), indium tin zinc oxide (ITZO), PEDOT, metal nanowires, graphene, and the like. In another exemplary embodiment of the present invention, the sensing signal lines 201 and the sensing electrodes 202 may include a metal such as molybdenum (Mo), silver (Ag), titanium (Ti), copper (Cu), and aluminum (Al), or an alloy thereof.

In an exemplary embodiment of the present invention, at least a portion of the sensing signal lines 201 may be located on the outer side of the end 180E of the second electrode 180. When at least a portion of the sensing signal lines 201 are located on the outer side of the end 180E of the second electrode 180, an area in which the sensing signal lines 201 are disposed may be increased, so that widths of the sensing signal lines 201 may be increased, or an interval between the sensing signal lines 201 may be increased. When the widths of the sensing signal lines 201 are increased, a resistance of the sensing signal lines 201 may be decreased, and when the interval between the sensing signal lines 201 are increased, the sensing signal lines 201 may be prevented from being shorted.

An overlapping area OA in which the first and second signal lines 121 and 131 and the sensing signal lines 201 overlap each other may be located in the peripheral area PA. A noise may be propagated upward from the first and second signal lines 121 and 131 within the overlapping area OA, and the noise may affect the sensing signal lines 201. For example, when there is no structure for shielding the propagation of noise between the first and second signal lines 121 and 131 and the sensing signal lines 201, there is a risk that sensing sensitivity of the sensing layer 200 may be reduced.

To prevent noise from being propagated from the first and second signal lines 121 and 131 to the sensing signal lines 201, the first lower conductive layer 141 of the first voltage supply line VSL1 and the second upper conductive layer 152 of the second voltage supply line VSL2 may extend to overlap each other. For example, the first lower conductive layer 141 may extend in the third direction DR3, and the second upper conductive layer 152 may extend in a fourth direction DR4 opposite to the third direction DR3. In this case, noise generated by the first and second signal lines 121 and 131 may be blocked.

Figure 5:
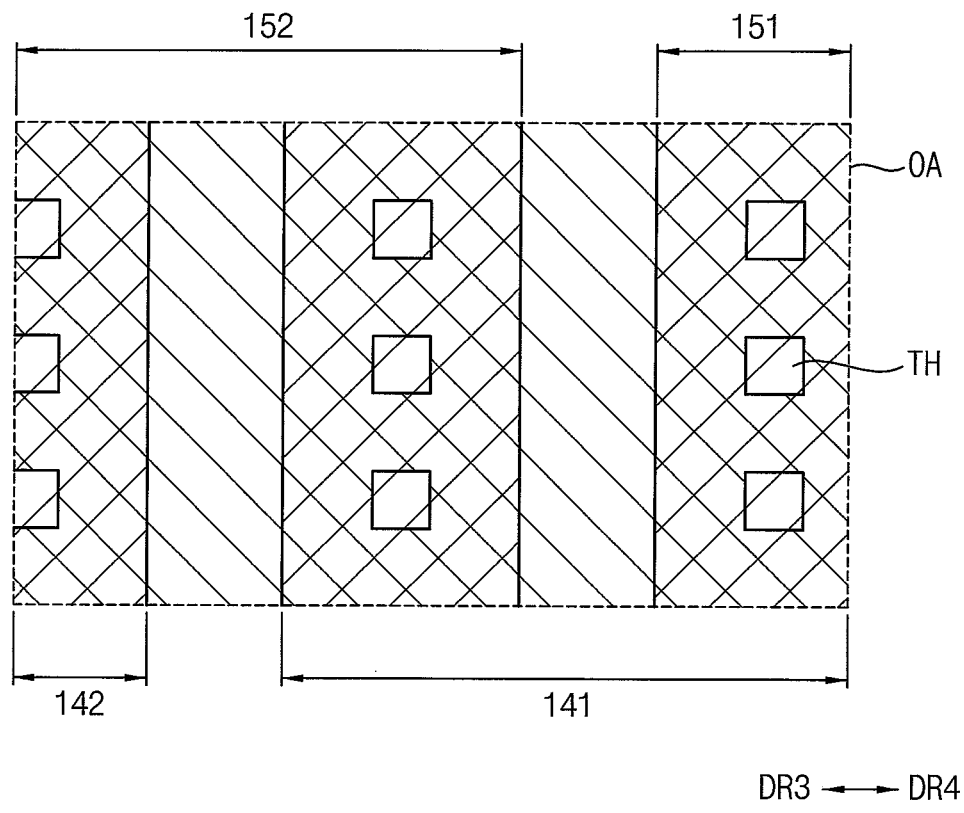
FIG. 5 is a plan view showing an overlapping area OA of FIG. 4.

FIG. 5 is a plan view showing an overlapping area OA of FIG. 4. FIG. 5 shows the first lower conductive layer 141 and the first upper conductive layer 151 of the first voltage supply line VSL1, and the second lower conductive layer 142 and the second upper conductive layer 152 of the second voltage supply line VSL2.

Referring to FIGS. 4 and 5, at least one of the first lower conductive layer 141 and the second upper conductive layer 152 may be located in the overlapping area OA in which the first and second signal lines 121 and 131 and the sensing signal lines 201 overlap each other. For example, the first lower conductive layer 141 and the second upper conductive layer 152 may be located in an area in which the first lower conductive layer 141 and the second upper conductive layer 152 overlap each other. In this case, the first lower conductive layer 141 may be located in the fourth direction DR4 from the area in which the first lower conductive layer 141 and the second upper conductive layer 152 overlap each other, and the second tipper conductive layer 152 may be located in the third direction DR3 from the area in which the first lower conductive layer 141 and the second upper conductive layer 152 overlap each other. At least one of the first lower conductive layer 141 and the second upper conductive layer 152 is located in the overlapping area OA, so that the first lower conductive layer 141 and the second upper-conductive layer 152 may form a shield between the first and second signal lines 121 and 131 and the sensing signal lines 201.

In a display device in the related art, the second electrode 180 may be used to shield the propagation of noise between the first and second signal lines 121 and 131 and the sensing signal lines 201. In this case, an area in which the sensing signal lines 201 are formed may be limited to an area that overlaps the second electrode 180 when viewed in a plan view. However, in the display device according to the embodiment of the present invention shown in FIGS. 4 and 5, the first voltage supply line VSL1 and the second voltage supply line VSL2 form a shield between the first and second signal lines 121 and 131 and the sensing signal lines 201, so that the sensing signal lines 201 may be formed in an area other than an area in which the second electrode 180 is disposed. In other words, the sensing signal lines 201 may be formed in areas that are not overlapped by the second electrode 180 in a plan view.

As described above, the fourth insulating layer 104 disposed between the first lower conductive layer 141 and the first upper conductive layer 151 of the first voltage supply line VSL1 and between the second lower conductive layer 142 and the second upper conductive layer 152 of the second voltage supply line VSL2 may be an organic insulating layer including an organic insulating material. A gas may be generated since the organic insulating material included in the organic insulating layer may be chemically decomposed over a long period of time, and when the gas moves to the display area DA without being discharged, the gas may affect the light emitting element EL, thereby deteriorating the light emitting element EL.

To smoothly discharge the gas generated in the fourth insulating layer 104, a plurality of through-boles TH may be provided in the first upper conductive layer 151 of the first voltage supply line VSL1 and the second upper conductive layer 152 of the second voltage supply line VSL2. The gas generated in the fourth insulating layer 104 may be smoothly discharged upward through the through-holes TH.

In an exemplary embodiment of the present invention, the through-boles TH may overlap the first lower conductive layer 141 of the first voltage supply line VSL1 and the second lower conductive layer 142 of the second voltage supply line VSL2. In other words, the through-holes TH may be formed in an area that overlaps the first lower conductive layer 141 or the second lower conductive layer 142. For example, the through-holes TH may be formed in an area of the first upper conductive layer 151 that overlaps the first lower conductive layer 141 and an area of the second upper conductive layer 152 that overlaps the first lower conductive layer 141 or the second lower conductive layer 142. In addition, the through-holes TH may not be formed in an area of the second upper conductive layer 152 that does not overlap the first lower conductive layer 141 or the second lower conductive layer 142. The through-holes TH are not formed in the area of the second upper conductive layer 152 that does not overlap the first lower conductive layer 141 or the second lower conductive layer 142, so that noise may be prevented from being propagated from the first and second signal lines 121 and 131 to the sensing signal lines 201 through the through-holes TH.

Figure 6:
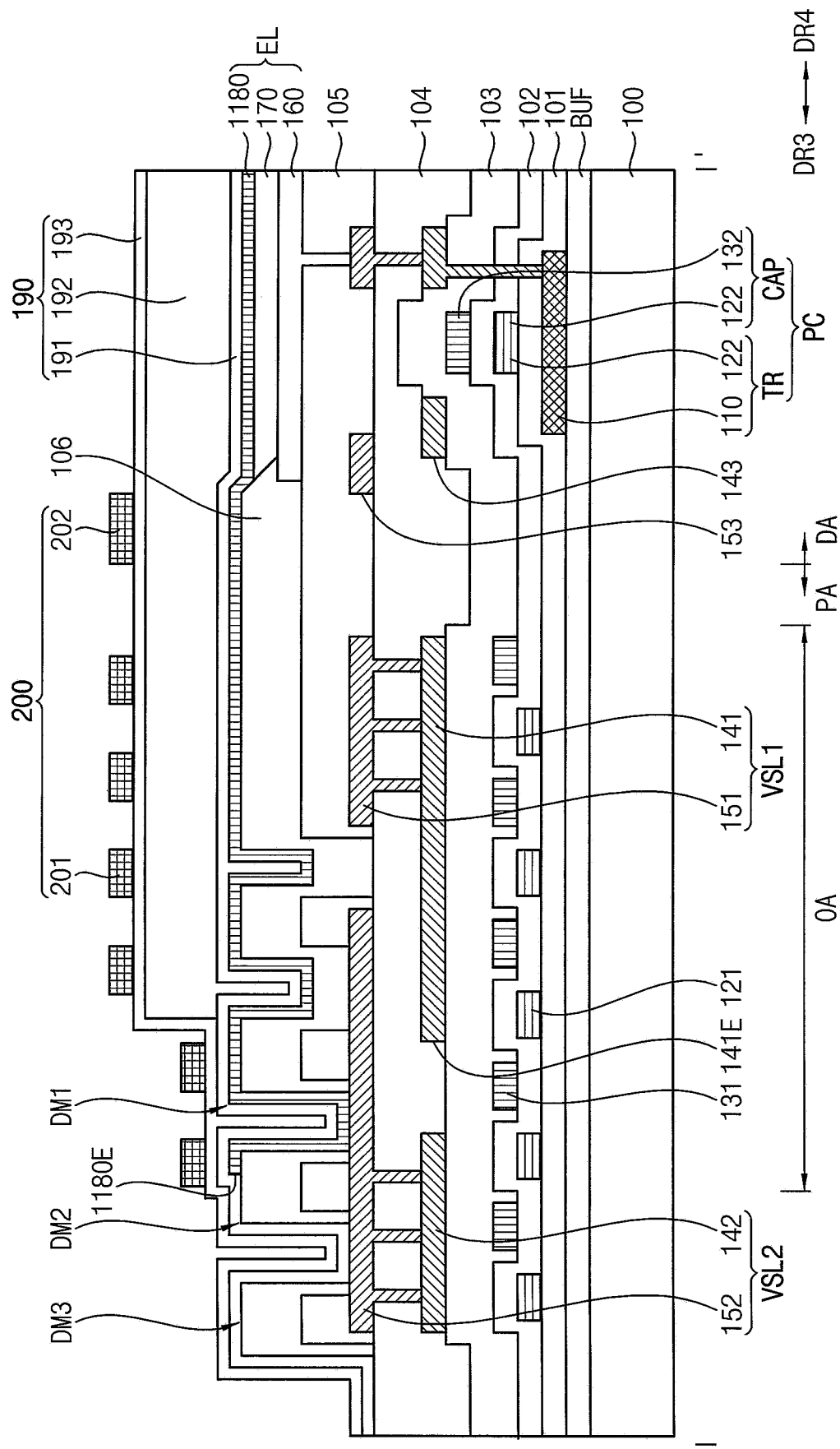
FIG. 6 is a sectional view showing a display device according to another exemplary embodiment of the present invention.

FIG. 6 is a sectional view showing a display device according to another exemplary embodiment of the present invention. FIG. 6 shows another example of the display device, taken along line I-I' of FIG. 1.

In the display device of FIGS. 6 and 7, descriptions of components substantially identical or similar to the components of the display device described with reference to FIGS. 4 and 5 may be omitted.

Referring to FIG. 6, an end 1180E of a second electrode 1180 may be located on an outer side of the end 141E of the first lower conductive layer 141. For example, the end 1180E of the second electrode 1180 may be located in the third direction DR3 from the end 141E of the first lower conductive layer 141. Since end 1180E of the second electrode 1180 is located on the outer side of the end 141E of the first lower conductive layer 141 the second electrode 1180 may also form a shield between the first and second signal lines 121 and 131 and the sensing signal lines 201 together with the first lower conductive layer 141 of the first voltage supply line VSL1 and the second upper conductive layer 152 of the second voltage supply line VSL2.

Figure 7:
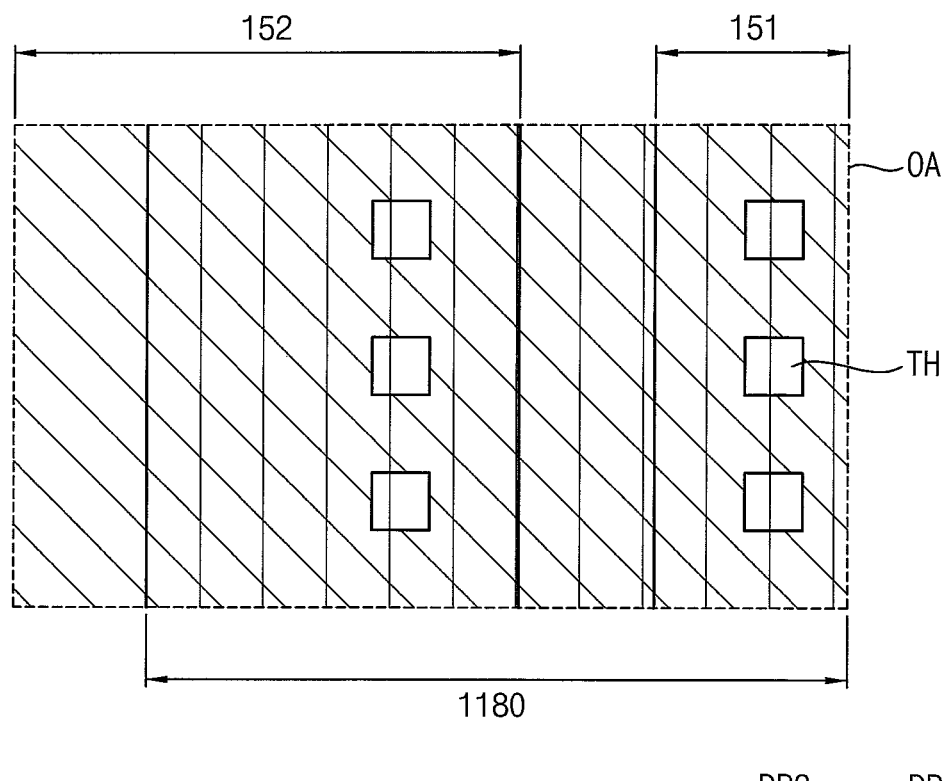
FIG. 7 is a plan view showing an overlapping area OA of FIG. 6.

FIG. 7 is a plan view showing an overlapping area OA of FIG. 6. FIG. 7 shows the first upper conductive layer 151 of the first voltage supply line VSL1, the second upper conductive layer 152 of the second voltage supply line VSL2, and the second electrode 1180.

Referring to FIGS. 6 and 7, through-holes TH may overlap the second electrode 1180. In other words, the through-holes TH may be formed in an area that overlaps the second electrode 1180. The through-holes TH are formed in an area of the first upper conductive layer 151 and an area of the second upper conductive layer 152, which overlap the second electrode 1180. Therefore, the second electrode 1180 may prevent noise from being propagated from the first and second signal lines 121 and 131 to the sensing signal lines 201 through the through-holes TH.

Figure 8:
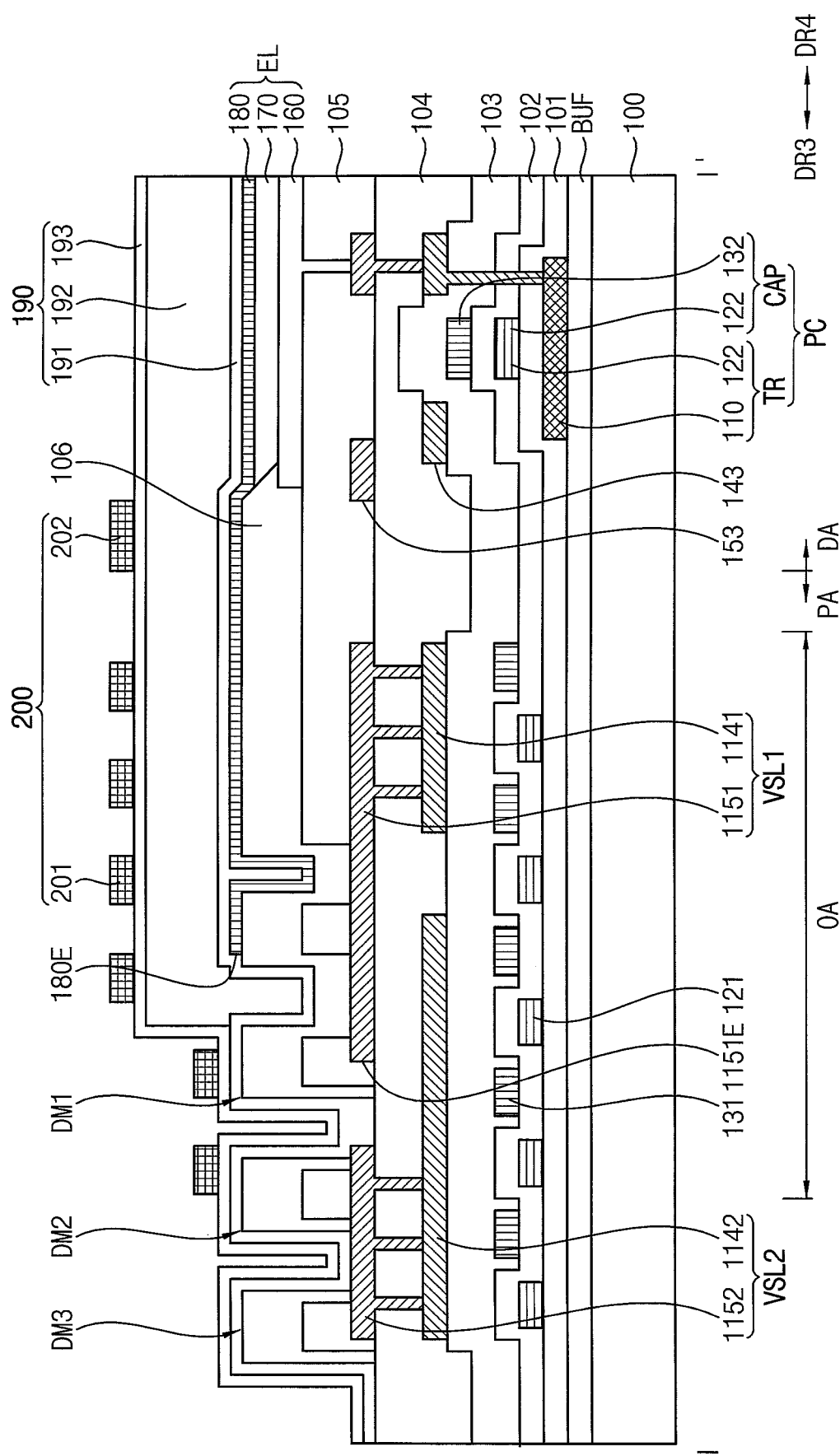
FIG. 8 is a sectional view showing a display device according to still another exemplary embodiment of the present invention.

FIG. 8 is a sectional view showing a display device according to another exemplary embodiment of the present invention. FIG. 8 shows another example of the display device, taken along line I-I' of FIG. 1.

In the display device of FIGS. 8 and 9, descriptions of components substantially identical or similar to the components of the display device described with reference to FIGS. 4 and 5 may be omitted.

In FIG. 8, an end 1151E of a first upper conductive layer 1151 may be located on the outer side of the end 180E of the second electrode 180. In other words, the end 180E of the second electrode 180 may be located on an inner side of the end 1151E of the first upper conductive layer 1151. For example, the end 1151E of the first upper conductive layer 1151 may be located in the third direction DR3 from the end 180E of the second electrode 180.

To prevent noise from being propagated from the first and second signal lines 121 and 131 to the sensing signal lines 201, the first upper conductive layer 1151 of the first voltage supply line VSL1 and a second lower conductive layer 1142 of the second voltage supply line VSL2 may extend to overlap each other. For example, the first upper conductive layer 1151 may extend in the third direction DR3, and the second lower conductive layer 1142 may extend in the fourth direction DR4.

Figure 9:
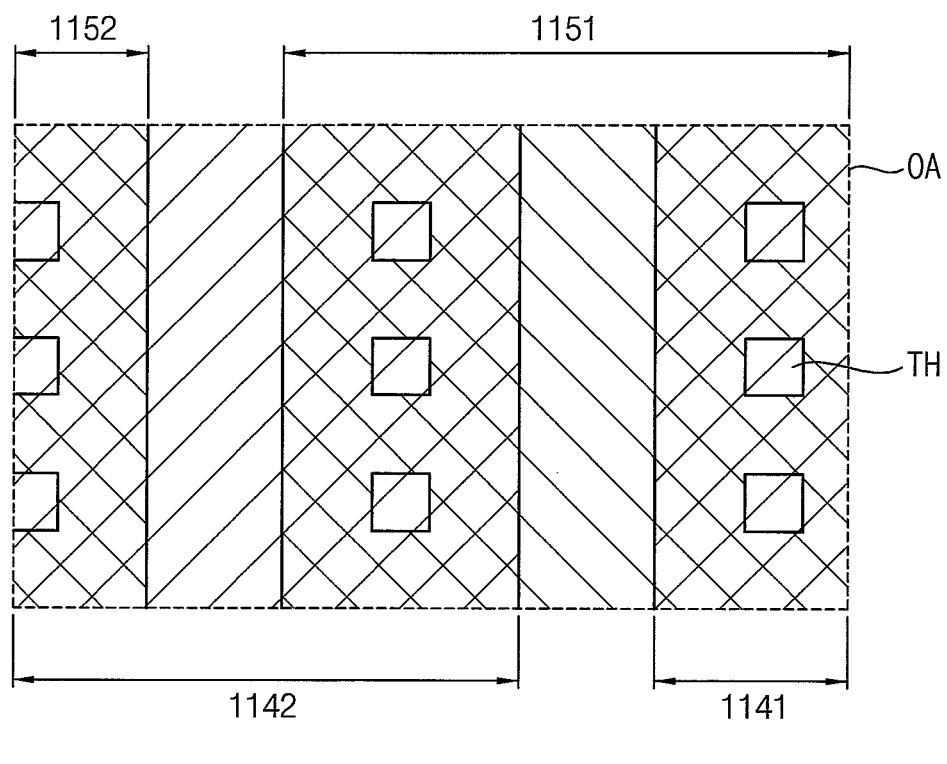
FIG. 9 is a plan view showing an overlapping area OA of FIG. 8.

FIG. 9 is a plan view showing an overlapping area OA of FIG. 8. FIG. 9 shows a first lower conductive layer 1141 and the first upper conductive layer 1151 of the first voltage supply VSL1, and the second lower conductive layer 1142 and a second upper conductive layer 1152 of the second voltage supply line VSL2.

Referring to FIGS. 8 and 9, at least one of the first upper conductive layer 1151 and the second lower conductive layer 1142 may be located in the overlapping area OA in which the first and second signal lines 121 and 131 and the sensing signal lines 201 overlap each other. For example, the first upper conductive layer 1151 and the second lower conductive layer 1142 may be located in an area in which the first upper conductive layer 1151 and the second lower conductive layer 1142 overlap each other. For example, the first upper conductive layer 1151 may be located in the fourth direction DR4 from the area in which the first upper conductive layer 1151 and the second lower conductive layer 1142 overlap each other, and the second lower conductive layer 1142 may be located in the third direction DR3 from the area in which the first upper conductive layer 1151 and the second lower conductive layer 1142 overlap each other. At least one of the first upper conductive layer 1151 and the second lower conductive layer 1142 is located in the overlapping area OA, so that the first upper conductive layer 1151 and the second lower conductive layer 1142 may function as a shield between the first and second signal lines 121 and 131 and the sensing signal lines 201.

To smoothly discharge the gas generated in the fourth insulating layer 104, a plurality of through-holes TH may be provided in the first upper conductive layer 1151 of the first voltage supply line VSL1 and the second upper conductive layer 1152 of the second voltage supply line VSL2. The gas generated in the fourth insulating layer 104 may be smoothly discharged upward through the through-holes TH.

As shown in FIGS. 8 and 9, the through-holes TH may overlap the first lower conductive layer 1141 of the first voltage supply line VSL1 and the second lower conductive layer 1142 of the second voltage supply line VSL2, In other words, the through-holes TH may be formed in an area that overlaps the first lower conductive layer 1141 or the second lower conductive layer 1142. For example, the through-holes TH may be formed in an area of the first upper conductive layer 1151 that overlaps the first lower conductive layer 1141 or the second lower conductive layer 1142 and an area of the second upper conductive layer 1152 that overlaps the second lower conductive layer 1142. In addition, the through-holes TH may not be formed in an area of the first upper conductive layer 1151 that does not overlap the first lower conductive layer 1141 or the second lower conductive layer 1142. The through-holes TH are not formed in the area of the first upper conductive layer 1151 that does not overlap the first lower conductive layer 1141 or the second lower conductive layer 1142. Therefore, noise may be prevented from being propagated from the first and second signal lines 121 and 131 to the sensing signal lines 201 through the through-holes TH.

The display device according to exemplary embodiments of the present invention may be applied to a display device included in a computer, a notebook, a mobile phone, a smartphone, a smart pad, a portable media player (PMP), a personal digital assistant (PDA), an MP3 player, or the like.

Exemplary embodiments of the present invention provide a display device for improving sensitivity of a sensing layer.

For example, in the display device according to exemplary embodiments of the present invention, the first voltage supply line configured to supply the first voltage and including the first lower conductive layer and the first upper conductive layer and the second voltage supply line configured to supply the second voltage and including the second lower conductive layer and the second upper conductive layer may be disposed between the plurality of signal lines and the sensing signal lines. The first lower conductive layer and the second upper conductive layer may extend to overlap each other, or the first upper conductive layer and the second lower conductive layer may extend to overlap each other. Accordingly, the first voltage supply line and the second voltage supply line may prevent noise from being propagated from the plurality of signal lines to the plurality of sensing signal lines, and the sensitivity of the sensing signal lines may be improved.

While the present invention has been particularly shown and described with reference to exemplary embodiments thereof, it will be apparent to those of ordinary skill in the art that various changes in form and detail may be made thereto.

What is claimed is:

1. A display device, comprising:
a substrate;
a pixel circuit disposed on the substrate;
a light emitting element including a first electrode electrically connected to the pixel circuit, a fight emitting layer disposed on the first electrode, and a second electrode disposed on the light emitting layer;
a plurality of signal lines disposed on the substrate;
a first voltage supply line overlapping the signal lines, configured to supply a first voltage to the pixel circuit, and including a first lower conductive layer and a first upper conductive layer disposed on the first lower conductive layer;
a second voltage supply line overlapping the signal lines, configured to supply a second voltage to the second electrode, and including a second lower conductive layer disposed on a same layer as the first lower conductive layer and a second upper conductive layer disposed on the second lower conductive layer on a same layer as the first upper conductive layer;
an encapsulation layer disposed on the second electrode, the first voltage supply line, and the second voltage supply line; and
a plurality of sensing signal lines disposed on the encapsulation layer,
wherein the first lower conductive layer and the second upper conductive layer at least partially overlap each other.

2. The display device of claim 1, wherein at least one of the first lower conductive layer and the second upper conductive layer is located in an area where the signal lines and the sensing signal lines overlap each other.

3. The display device of claim 1, wherein at least a portion of the sensing signal lines are not overlapped by the second electrode.

4. The display device of claim 1, wherein an end of the first lower conductive layer extends beyond an end of the second electrode along a direction parallel to a surface of the substrate.

5. The display device of claim 1, wherein an end of the second electrode extends beyond an end of the first lower conductive layer along a direction parallel to a surface of the substrate.

6. The display device of claim 1, wherein the pixel circuit includes a transistor, and
at least one of the signal lines is disposed on a same layer as a gate electrode of the transistor.

7. The display device of claim 6, wherein the pixel circuit further includes a capacitor, and
at least one of the signal lines is disposed on a same layer as an electrode of the capacitor.

8. The display device of claim 1, further comprising a data line configured to supply a data signal to the pixel circuit,
wherein the first lower conductive layer and the second lower conductive layer are disposed on a same layer as the data line.

9. The display device of claim 1, further comprising a first voltage line connecting the first voltage supply line to the pixel circuit,
wherein the first upper conductive layer and the second upper conductive layer are disposed on a same layer as the first voltage line.

10. The display device of claim 1, further comprising a plurality of dams disposed between the second voltage supply line and the encapsulation layer.

11. The display device of claim 10, wherein the encapsulation layer includes at least one inorganic encapsulation layer and at least organic encapsulation layer, and
an end of the at least one organic encapsulation layer is adjacent to a side of at least one of the dams.

12. The display device of claim 1, further comprising an organic insulating layer disposed between the first lower conductive layer and the first upper conductive layer and between the second lower conductive layer and the second upper conductive layer.

13. The display device of claim 1, wherein a plurality of through-holes are provided in the second upper conductive layer.

14. The display device of claim 13, wherein the through-holes overlap the first lower conductive layer.

15. The display device of claim 13, wherein the through-holes overlap the second electrode.

16. A display device, comprising:
a substrate;
a pixel circuit disposed on the substrate;
a light emitting element including a first electrode electrically connected to the pixel circuit, a light emitting layer disposed on the first electrode, and a second electrode disposed on the light emitting layer;
a plurality of signal lines disposed on the substrate;
a first voltage supply line overlapping the signal lines, configured to supply a first voltage to the pixel circuit, and including a first lower conductive layer and a first upper conductive layer disposed on the first lower conductive layer;
a second voltage supply line overlapping the signal lines, configured to supply a second voltage to the second electrode, and including a second lower conductive layer disposed on a same layer as the first lower conductive layer and a second upper conductive layer disposed on the second lower conductive layer on a same layer as the first upper conductive layer;
an encapsulation layer disposed on the second electrode the first voltage supply line, and the second voltage supply line; and
a plurality of sensing signal lines disposed on the encapsulation layer,
wherein the first upper conductive layer and the second lower conductive layer at least partially overlap each other.

17. The display device of claim 16, wherein at least one of the first upper conductive layer and the second lower conductive layer is located in an area where the signal lines and the sensing signal lines overlap each other.

18. The display device of claim 16, wherein at least a portion of the sensing signal lines do not overlap the second electrode.

19. The display device of claim 16, wherein an end of the first upper conductive layer extends beyond an end of the second electrode along a direction parallel to a surface of the substrate.

20. The display device of claim 16, wherein a plurality of through-holes overlapping the second lower conductive layer are provided in the first upper conductive layer.

21. A display device, comprising:
a substrate;
a pixel circuit disposed on the substrate;
a light emitting element including a first electrode and a second electrode, wherein the first electrode is electrically connected to the pixel circuit;
a plurality of signal lines disposed on the substrate;
a first voltage supply line overlapping the signal lines, configured to supply a first voltage to the pixel circuit, and including a first conductive layer;
a second voltage supply line overlapping the signal lines, configured to supply a second voltage to the second electrode, and including a second conductive layer;
an encapsulation layer disposed on the second electrode, the first voltage supply line, and the second voltage supply line; and
a plurality of sensing signal lines disposed on the encapsulation layer,
wherein the first conductive layer and the second conductive layer overlap the signal lines.

* * * * *